(12) United States Patent
Gendler

(10) Patent No.: US 8,307,226 B1
(45) Date of Patent: Nov. 6, 2012

(54) METHOD, APPARATUS, AND SYSTEM FOR REDUCING LEAKAGE POWER CONSUMPTION

(75) Inventor: Alexander Gendler, Kiriat Motzkin (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/331,854

(22) Filed: Dec. 20, 2011

(51) Int. Cl.
*G06F 1/00* (2006.01)
*G06F 1/32* (2006.01)

(52) U.S. Cl. .................. 713/300; 713/320; 713/324

(58) Field of Classification Search .............. 713/300, 713/320, 324
See application file for complete search history.

(56) References Cited

U.S. PATENT DOCUMENTS

| | | | |
|---|---|---|---|
| 6,946,869 B2 * | 9/2005 | Jacobson et al. | 326/33 |
| 7,313,713 B2 * | 12/2007 | Weber et al. | 713/324 |
| 7,808,273 B2 * | 10/2010 | Flynn | 326/46 |
| 8,060,204 B2 * | 11/2011 | Huelskamp et al. | 607/27 |
| 2007/0147572 A1 * | 6/2007 | Dasgupta et al. | 377/64 |
| 2010/0289528 A1 * | 11/2010 | Lau et al. | 326/93 |
| 2011/0148496 A1 * | 6/2011 | Sriadibhatla | 327/202 |

OTHER PUBLICATIONS

Chpra et al, Efficient Algorithms for Identifying the Minimum Leakage States in CMOS Combinational Logic, 2004, IEEE, pp. 6.*
Abdollahi et al, Leakage Current Reduction in CMOS VLSI Circuits by Input Vector Control, Feb. 2004, IEEE, pp. 15.*

* cited by examiner

*Primary Examiner* — Suresh Suryawanshi
(74) *Attorney, Agent, or Firm* — Blakely, Sokoloff, Taylor & Zafman LLP

(57) ABSTRACT

Described herein are method, apparatus, and system for reducing leakage power consumption. The method comprises determining an input vector for input to a logic unit, the input vector for generating a least leakage power dissipation in the logic unit; and applying the input vector to the logic unit when a clock signal associated with the logic unit is gated. The method results in reduced leakage power consumption for the logic unit when the logic unit is not active with performing its normal operation, i.e. when the logic unit is idle.

18 Claims, 6 Drawing Sheets

| Input Value | OFF transistors | Leakage |
|---|---|---|
| A=0 B=0 | N0, N1 | (10+10)/10=2 |
| A=0 B=1 | N0, P1 | 10+20=30 |
| A=1 B=0 | N1, P0 | 10+20=30 |
| A=1 B=1 | P0, P1 | 20+20=40 |

| Input Value | OFF transistors | Leakage |
|---|---|---|
| A=0 B=0 | N0, N1 | 10+10=20 |
| A=0 B=1 | N0, P1 | 10+20=30 |
| A=1 B=0 | N1, P0 | 10+20=30 |
| A=1 B=1 | P0, P1 | (20+20)/10=4 |

METHOD, APPARATUS, AND SYSTEM FOR REDUCING LEAKAGE POWER CONSUMPTION

FIELD OF THE INVENTION

Embodiments of the invention relate generally to the field of processors. More particularly, embodiments of the invention relate to method, apparatus, and system for reducing leakage power consumption.

BACKGROUND

Power consumption is a measure of performance of a processor. As consumer electronic devices such as laptops, desktops, net-books, e-books, smart-phones, PC tablets, and other smart devices, become popular and in high demand, battery life of these consumer electronic devices also becomes important. Manufacturers and designers of these consumer electronic devices routinely place these devices in "sleep modes" when the devices are inactive to save battery life and lower power consumption. The term "sleep mode" herein generally refers to operating a processor or device in lower power mode, in which the processor is not completely turned off but is operated at a power level to retain its memory content so that it may wake up for normal operation from the point it went into sleep mode.

However, in such "sleep modes," the processors in the consumer devices continue to dissipate leakage power caused by inherent leakage current in transistors even when the transistors are off. Leakage current is also referred to as sub-threshold current. Efforts to minimize leakage include the use of strained silicon, high-k dielectrics, and/or stronger dopant levels in the semiconductor. However, such efforts are process technology related efforts.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

FIG. 2B is a table showing leakage units for various input settings of a NAND gate of the exemplary combinational logic, wherein the leakage units are used for determining input settings to the NAND gate to reduce leakage power consumption of the combinational logic of the pipeline architecture, according to one embodiment of the invention.

FIG. 2C is a table showing leakage units for various input settings of a NOR gate of the exemplary combinational logic, wherein the leakage units are used for determining input settings to the NOR gate to reduce leakage power consumption of the combinational logic of the pipeline architecture, according to one embodiment of the invention.

DETAILED DESCRIPTION

Figure 1:
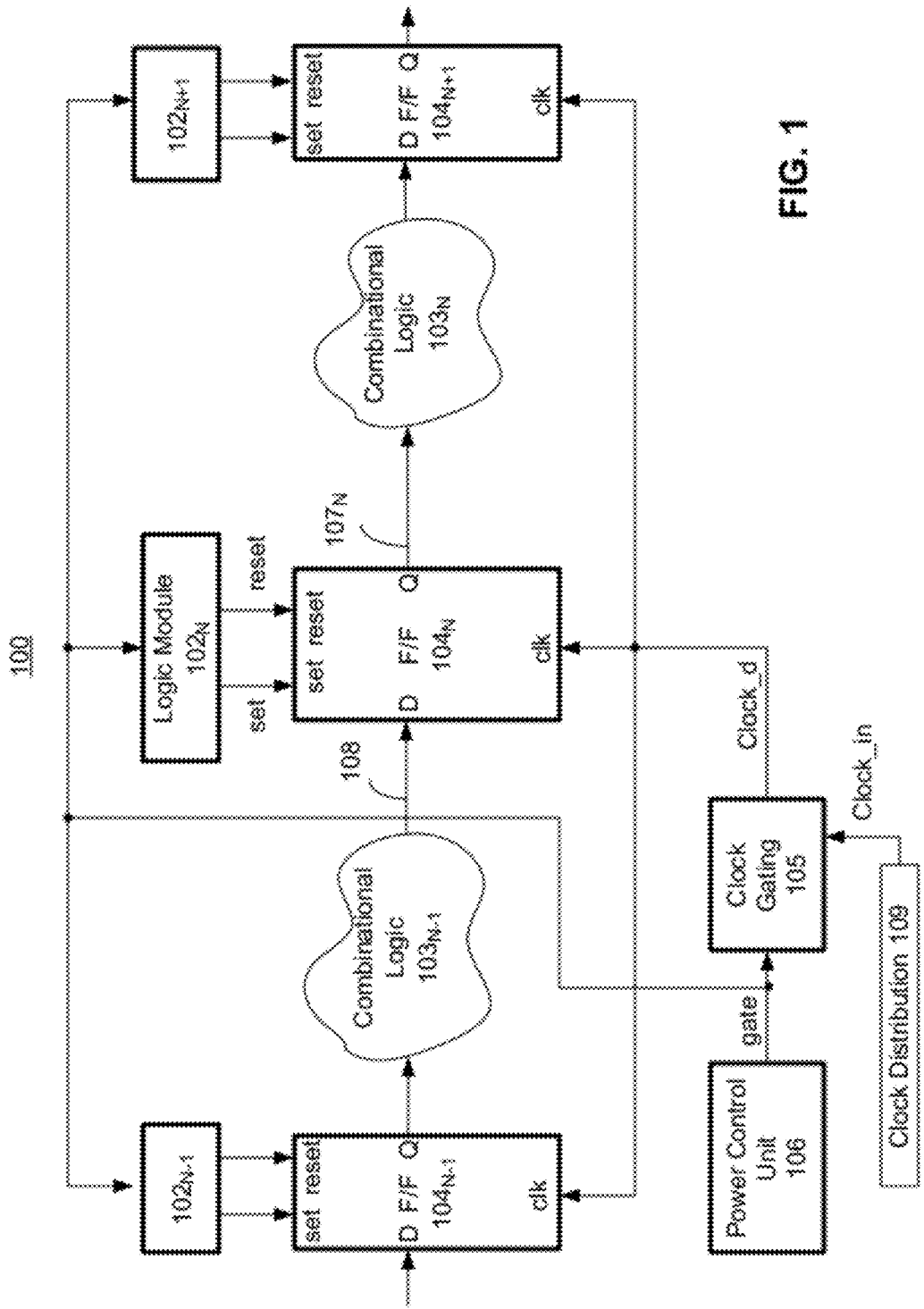
FIG. 1 is logical view of a pipeline architecture which is operable to reduce leakage power consumption, according to one embodiment of the invention.

Embodiments of the invention relate to an apparatus, method, and system for reducing leakage power consumption in a processor. In one embodiment, an input vector to combinational logic gates that results in least leakage power consumption for the combinational logic gates is determined. In one embodiment, this input vector is saved in memory for the combinational logic gates. During the time when the combinational logic gates are inactive or are not being used, for example clock gating is enabled causing no clock propagation to sequential logic units driving data to the combinational logic gates, and stable data values are input to the combinational logic gates, i.e. data is not changing, the input vector is loaded in from a logic module and/or memory for the combinational logic gates. In such an embodiment, the combinational logic gates consume least leakage power dissipation because the combinational logic gates are using the input vector that generates the least leakage power consumption for the combinational logic gates.

In one embodiment, when the combinational logic gates need to be active for normal operation, the input vector is no longer loaded to the combinational logic gates and so the combinational logic gates receive regular data for their input from the sequential logic units. In one embodiment, the combinational logic gates are loaded with previous data values, i.e. data values that were input to the combinational logic gates before the combinational logic gates became inactive and before the input vector for least leakage power dissipation was loaded as input to the combinational logic gates. In one embodiment, the input vector is programmable by software or hardware.

The technical effects of the embodiments discussed herein are many and include reduced leakage power consumption for combinational logic gates when the combinational logic gates are not active with performing their normal operation, i.e. when the combinational logic gates are idle. In some embodiments, the leakage power consumption for combinational logic gates when they are idle is reduced by 30% using the least leakage input vector compared to when no such special least leakage input vector is applied to the combinational logic gates when they are idle.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

FIG. 1 is logical view of a pipeline architecture 100 which is operable to reduce leakage power consumption, according to one embodiment of the invention. The pipeline architecture 100 comprises a series of sequential logic units $104_N$, $104_{N-1}$, and $104_{N+1}$ that receive input from respective combinational logic gates $103_{N-2}$ (not shown) $103_{N-1}$, $103_N$, and $103_{N+1}$ (not shown), and output sampled data to the combinational logic gates $103_{N-1}$, $103_N$, and $103_{N+1}$. In one embodiment, the output of the sequential logic units $104_N$, $104_{N-1}$, and $104_{N+1}$ can be set to predetermined values.

For example, the sequential logic units $104_N$, $104_{N-1}$, and $104_{N+1}$ are flip-flops (F/Fs) which are operable to be set or reset according to the signal levels of set and reset signals input to the F/Fs. In the embodiments discussed herein, when the set signal is logical high then the output of the F/F $104_N$ is set to logical high level, and when the reset signal is logical high then the output of the F/F $104_N$ is set to logical low level. However, a person skilled in the art would appreciate that any sequential logic unit which is capable of setting logical low and high signal levels at the output in response to a logical level of a signal (e.g., set and/or reset signal) can be used without changing the scope of the embodiments of the invention.

In one embodiment, the pipeline architecture 100 includes logic modules $102_{N-1}$, $102_N$, and $102_{N+1}$ for storing and/or applying an input vector to respective sequential logic units $104_N$, $104_{N-1}$, and $104_{N+1}$ for generating least leakage power in respective combinational logic gates $103_{N-1}$, $103_N$, and $103_{N+1}$ (not shown). So as not to obscure the embodiments of the invention, in the following embodiments, the logic module $102_N$, the sequential logic unit $104_N$, and the combinational logic gates $103_N$ are discussed.

For example, the logic module $102_N$ (also called the first logic module) is operable to provide set and reset signals to the sequential logic unit $104_N$ so that the sequential logic unit $104_N$ provides an input vector $107_N$ to the combinational logic gates $103_N$ to cause the combinational logic gates $103_N$ to consume the least leakage power dissipation. In one embodiment, the input vector values $107_N$ are stored in a memory unit (e.g., cache memory) and provided to the logic module $102_N$ when the clock signal to the sequential logic unit $104_N$ is clock gated by a clock gating unit 105. In one embodiment, the previous values stored in sequential logic unit $104_N$ are stored in memory so that they may be input to the combinational logic gates $103_N$ when the clock signal to the sequential logic unit $104_N$ is clock un-gated by the clock gating unit 105.

The term "clock gating" herein refers to stopping the clock signal from propagating to a logic unit so that the transistors in the logic unit receiving the clock signal do not switch/toggle. The term "clock un-gating" herein refers to resuming the clock signal to propagate the clock signal to a logic unit so that the transistors in the logic unit receiving the clock signal are capable of switching/toggling.

In one embodiment, the clock gating unit 105 generates a signal clock_d which is either a delayed version of clock_in signal from a clock distribution network 109 or a gated clock signal caused by the (assertion or de-assertion) of the gate signal from the power control unit 106. In one embodiment, clock un-gating causes the sequential logic unit $104_N$ to propagate input data 108 as output data $107_N$. In such an embodiment, the gate signal level is such that the clock gating unit 105 passes on the clock_in signal as clock_d signal. In one embodiment, clock gating causes the sequential logic unit $104_N$ to freeze, i.e. hold constant, the output data $107_N$. In such an embodiment, the gate signal level is such that the clock gating unit 105 does not pass on the clock_in signal as clock_d signal, but causes the clock_d signal to be constant (e.g., constant logical low level).

In one embodiment, the gate signal is generated by a power control unit 106 which is operable to lower dynamic power dissipation of the sequential logic unit $104_N$ and combinational logic gate $103_N$. In one embodiment, the gate signal is also received by the logic module $102_N$. In such an embodiment, when the gate signal is of such a logical level so as to cause the clock gating unit 105 to gate, i.e. stop the clock signal clock_in from propagating as output signal clock_d, the logic module $102_N$ provides the set and reset signals to the sequential unit $104_N$ so that the combinational logic gates $103_N$ receive an input vector which causes the least leakage power dissipation in the combinational logic gates $103_N$, i.e. low leakage mode.

In one embodiment, when the gate signal is of such a logical level so as to cause the clock gating unit 105 to propagate the clock signal clock_in as output signal clock_d, the logic module $102_N$ provides the set and reset signals to the sequential unit $104_N$ so that the combinational logic gates $103_N$ receive the sampled data 108 as input $107_N$, i.e. normal operation. In one embodiment, the power control unit 106 may be enabled or disabled by an operating system.

By applying the input vector to the combinational logic gates $103_N$ that results in least leakage power dissipation in the combinational logic gates $103_N$, when the clock signal clock_d to the sequential logic unit $104_N$ is gated, overall power dissipation of the combinational logic gates $103_N$ is reduced.

Figure 2A:
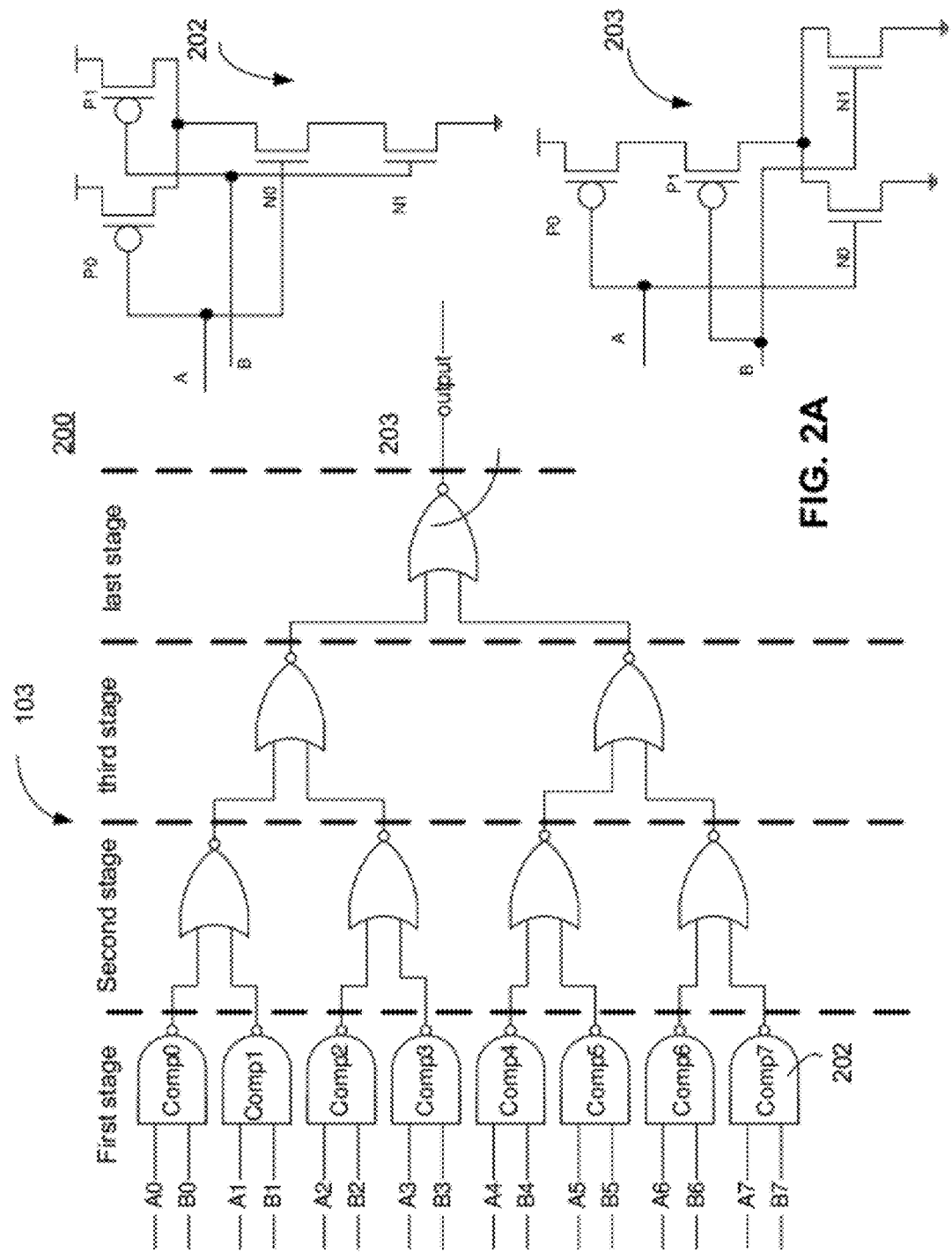
FIG. 2A is an exemplary combinational logic of the pipeline architecture with inputs set to reduce leakage power consumption, according to one embodiment of the invention.

FIG. 2A is an exemplary combinational logic 200 of the pipeline architecture 100 with inputs set to reduce leakage power consumption, according to one embodiment of the invention. FIG. 2A is described with reference to FIGS. 2B-C. The exemplary combinational logic 200 is not a limitation of the embodiments of the invention but is illustrated to show how the least leakage input vector is determined for a combinational logic. The same method is applicable to any combinational logic unit.

In this exemplary embodiment, the combinational logic 200 comprises the combinational logic gates $103_N$ (of FIG. 1) which include NAND gates and NOR gates. In this exemplary embodiment, the NAND gates receive the input signals A0-A7 and B0-B7. A transistor level NAND gate is shown as circuit 202 while a transistor level NOR gate is shown as circuit 203.

FIG. 2B is a table 210 showing leakage units (e.g., current or power) for various inputs of the NAND gate 202 of the exemplary combinational logic gates $103_N$. The leakage units herein are used for determining input settings (values for A0-A7 and B0-B7) for the NAND gates 202 to reduce leakage power consumption of the combinational logic gates $103_N$ of the pipeline architecture 100, according to one embodiment of the invention.

The left column lists the input values to the gate terminals of the NAND gate 202. The middle column lists the transistors of the NAND gate 202 which are off for the corresponding input signals listed in the left column. The right column is the leakage current (or power dissipation) of the NAND gate 202 corresponding to the input signals listed in the left column.

In one embodiment, a leakage current or power is assigned to each transistor (N0, N1, P0, and P1) and for various transistor sizes (W/L). For example, a database of leakage information is prepared for all transistor types and transistor sizes used in combinational logic gates. For illustrating purposes, the leakage of the N-transistors (N0, N1) is 10 units while the leakage of the P-transistors (P0, P1) is 20 units. In the NAND gate 202, transistors P0 and P1 are parallel transistors while transistors N0 and N1 are series transistors. In the NOR gate 203, transistors N0 and N1 are parallel transistors while transistors P0 and P1 are series transistors.

In this example, leakage from parallel transistors is a sum of the leakages of the parallel transistors. For example, when inputs A and B to the 2-input NAND gate 202 are A=0, B=1; A=1, B=0; and A=1, B=1 the leakage of the off transistors is the sum of the leakages of the off transistors which are 30, 30, and 40 units respectively.

In this example, leakage of transistors in series or inline is 10 times lower than the sum of the leakages of the transistors in series. For example, when the inputs A and B are both zeros (A=0, B=0) then transistors N0 and N1 are off and so the leakage is the sum of the leakages of the two N-transistors divided by 10, which is 2 units respectively. In other embodiments, other values of leakage units and leakage calculation rules for inline and parallel transistors may be used without changing the scope of the embodiments of the invention.

FIG. 2C is a table 220 showing leakage units for various inputs of a NOR gate of the exemplary combinational logic $103_N$, wherein the leakage units are used for determining input settings for the NOR gate to reduce leakage power consumption of the combinational logic unit $103_N$ of the pipeline architecture 100, according to one embodiment of the invention.

The left column lists the input values to the gate terminals of the NOR gate 203. The middle column lists the transistors of the NOR gate 203 which are off for the corresponding input signals listed in the left column. The right column is the leakage current (or power dissipation) of the NOR gate 203 corresponding to the input signals listed in the left column.

In this example, leakage of transistors in series or inline is 10 times lower than the sum of the leakages of the transistors in series. For example, when the inputs A and B are both logical high levels (A=1, B=1) then transistors P0 and P1 are off and so the leakage is the sum of the leakages of the two P-transistors divided by 10, which is 4 units respectively.

In the example of FIG. 2B, the maximum leakage, i.e. 40 units, of the NAND gate 202 is 20 times higher than the minimum leakage, i.e. 2 units, of the NAND gate 202. Applying an input vector for the NAND gate 202 with input values set to zeros for inputs A and B, i.e. A=0 and B=0, least leakage power consumption of 2 units is achieved with an output which is logical high, according to one embodiment of the invention.

In the example of FIG. 2C, the maximum leakage, i.e. 30 units, of the NOR gate 203 is 15 times higher than the minimum leakage, i.e. 4 units, of the NOR gate 203. Applying an input vector for the NOR gate 203 with input values set to logical high levels for inputs A and B, i.e. A=1 and B=1, least leakage power consumption of 4 units is achieved with an output which is logical low, according to one embodiment of the invention.

Referring to FIG. 2A with reference to FIG. 2B and FIG. 2C, when the input vector is set to zero, i.e. inputs A0 to A7 are set to zeros and inputs B0 to B7 are set to zeros, then the first stage of NAND gates 202 will have a combined leakage power dissipation of 2×8=16 units. In this example, the second stage of the combinational logic $103_N$ will receive all ones as inputs to the NOR gates 203 resulting in combined leakage power dissipation of 4×4=16 units. Continuing with the example, the third stage of the combinational logic $103_N$ will receive all zeros as inputs to the NOR gates 203 resulting in combined leakage power dissipation of 20×2 units. In the last stage of the combinational logic $103_N$, both inputs to the NOR gate 203 are ones resulting in leakage power dissipation of 4 units. The overall leakage power dissipation of the combinational logic unit is determined to be 2×8+4×4+20×2+4=76 units, which is the least leakage power dissipation for the combinational logic unit $103_N$.

If the input vector A0-A7 and B0-B7 is not set to the least leakage power dissipation vector, and is allowed to have random values then the minimum leakage power dissipation of the combinational logic $103_N$ is 272 units which is much higher than 76 units for the least leakage power dissipation input vector. One reason for the higher leakage power dissipation of 272 units for the combinational logic $103_N$ is that in the first stage, two NAND gates 202 have inputs 00 (A=0, B=0), two NAND gates 202 have inputs 01 (A=0, B=1), two NAND gates 202 have inputs 10 (A=1, B=0), and two NAND gates have inputs 11 (A=1, B=1). The leakage power dissipation of the first stage is 2×2+2×30+2×30+2×40=144 units. The second level inputs to the second stage (NOR gates 203) have 6 zeros and 2 ones as inputs to the NOR gates 203, i.e. the inputs are 00, 00 and two variations of 01, 01 or 00, 11. The minimal leakage power dissipation for the second stage will be 64 units. The third stage (NOR gates 203) has 3 ones and 1 zero as inputs to the NOR gates 203. The minimal leakage power dissipation of the third stage is 34 units. The last stage has leakage power dissipation of 30 units. The total minimal leakage power dissipation for random input vector to the input of the combinational logic $103_N$ is 144+64+34+30=272 units.

In this embodiment, the least leakage input vector results is 4 times smaller leakage power dissipation for the combinational logic gates $103_N$ than the leakage power dissipation for the combinational logic gates $103_N$ with random input vector. By applying the least leakage input vector to the combinational logic $103_N$ when the sequential logic unit $104_N$ is inactive, i.e. clock_d is gated and not switching, leakage power dissipation can be saved by a multiple of 4 times compared to the situation when leakage input vector is not applied to combinational logic $103_N$, i.e. when a random input vector is applied to the combinational logic $103_N$.

Figure 3:
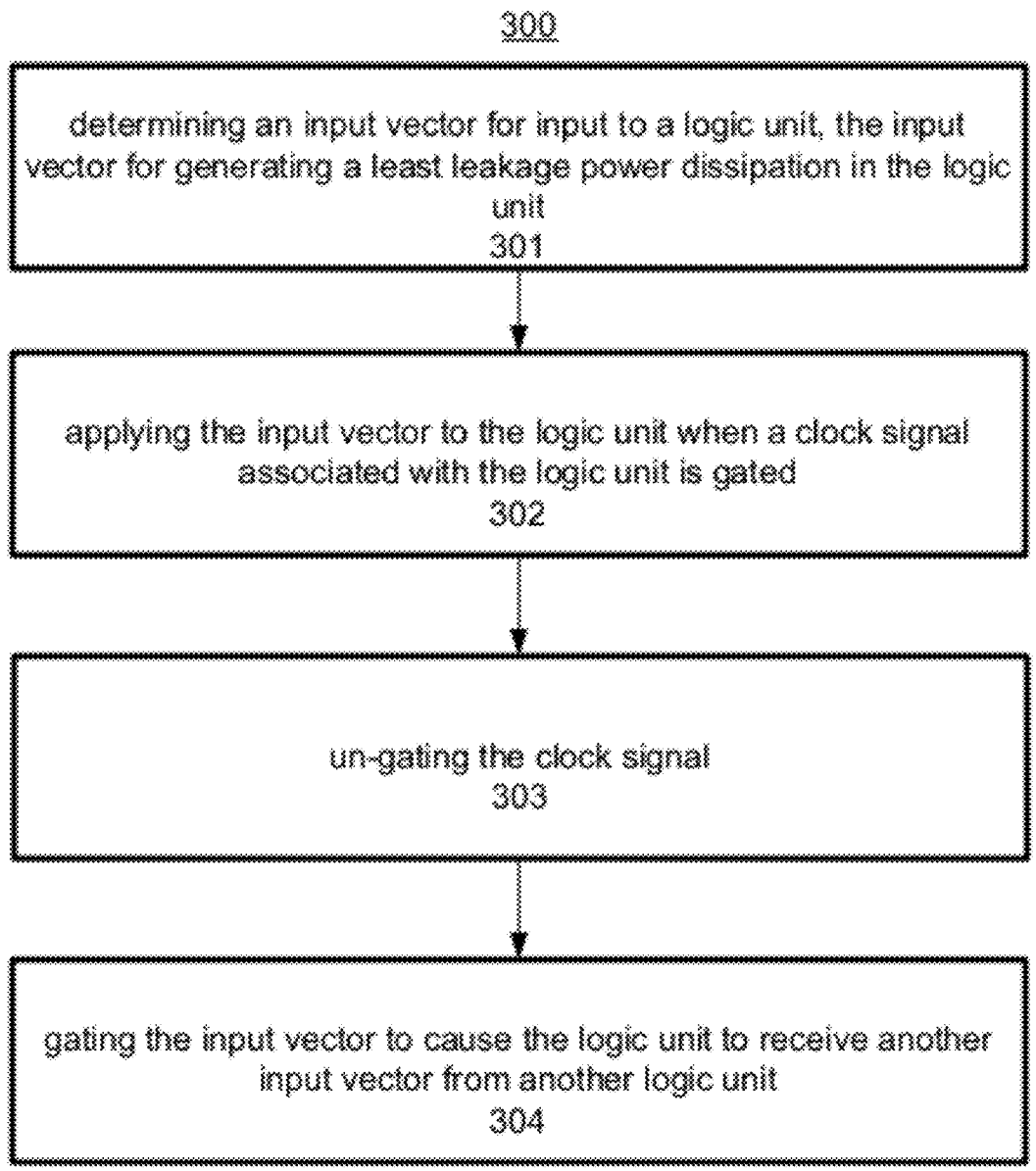
FIG. 3 is a method flowchart for reducing leakage power consumption, according to one embodiment of the invention.

FIG. 3 is a method flowchart 300 for reducing leakage power consumption, according to one embodiment of the invention. Although the blocks in the flowchart 300 are shown in a particular order, the order of the actions can be modified. Thus, the illustrated embodiments can be performed in a different order, and some actions/blocks may be performed in parallel. Additionally, one or more actions/blocks can be omitted in various embodiments of reducing leakage power consumption in the processor. The flowchart of FIG. 3 is illustrated with reference to the embodiments of FIGS. 1-2.

At block 301, an input vector is determined for a combinational logic unit $103_N$, wherein the input vector is a vector that results in least leakage power dissipation for the combinational logic unit $103_N$. For example, for the combinational logic unit $103_N$ of FIG. 2A, the input vector is all zeros, i.e. A0-A7 and B0-B7 are all zeros. In one embodiment, an input vector is determined for each combinational logic unit of the processor. In one embodiment, the input vector is determined during design verification of the combinational logic unit $103_N$. In one embodiment, the input vector is stored in a machine-readable storage medium, e.g., a cache memory, a system memory. In one embodiment, the input vector can be modified by software or hardware.

Referring back to FIG. 3, at block 302 the input vector is applied by the first logic module $102_N$ and the sequential logic unit $104_N$ to the combinational logic unit $103_N$ when the clock_d signal is gated by the clock gating unit 105. The application of the input vector to the combinational logic unit $103_N$ causes the combinational logic unit $103_N$ to dissipate the least leakage power consumption. As mentioned herein, clock gating stops the clock_d signal from toggling (switching) and thus the input 108 to the sequential logic unit $104_N$ is not propagated as output $107_N$. In one embodiment, the values of the input vector $107_N$ are stored in cache memory or system memory when the clock_d signal is gated. In such an embodiment, these stored values of the input vector $107_N$ are provided as input to the combinational logic unit $103_N$ when the clock_d signal is un-gated.

At block 303, the clock_d signal is un-gated by the clock gating unit 105. As mentioned herein, clock un-gating restores the propagation of clock_in signal as clock_d signal and thus the input 108 to the sequential logic unit $104_N$ is propagated as output $107_N$. At block 304, the first logic module $102_N$ is gated so that it no longer applies the input vector to the sequential logic unit $104_N$. In such an embodiment, the combinational logic unit $103_N$ receives the vector 108 from $103_{N-1}$ (another logic unit).

Figure 4:
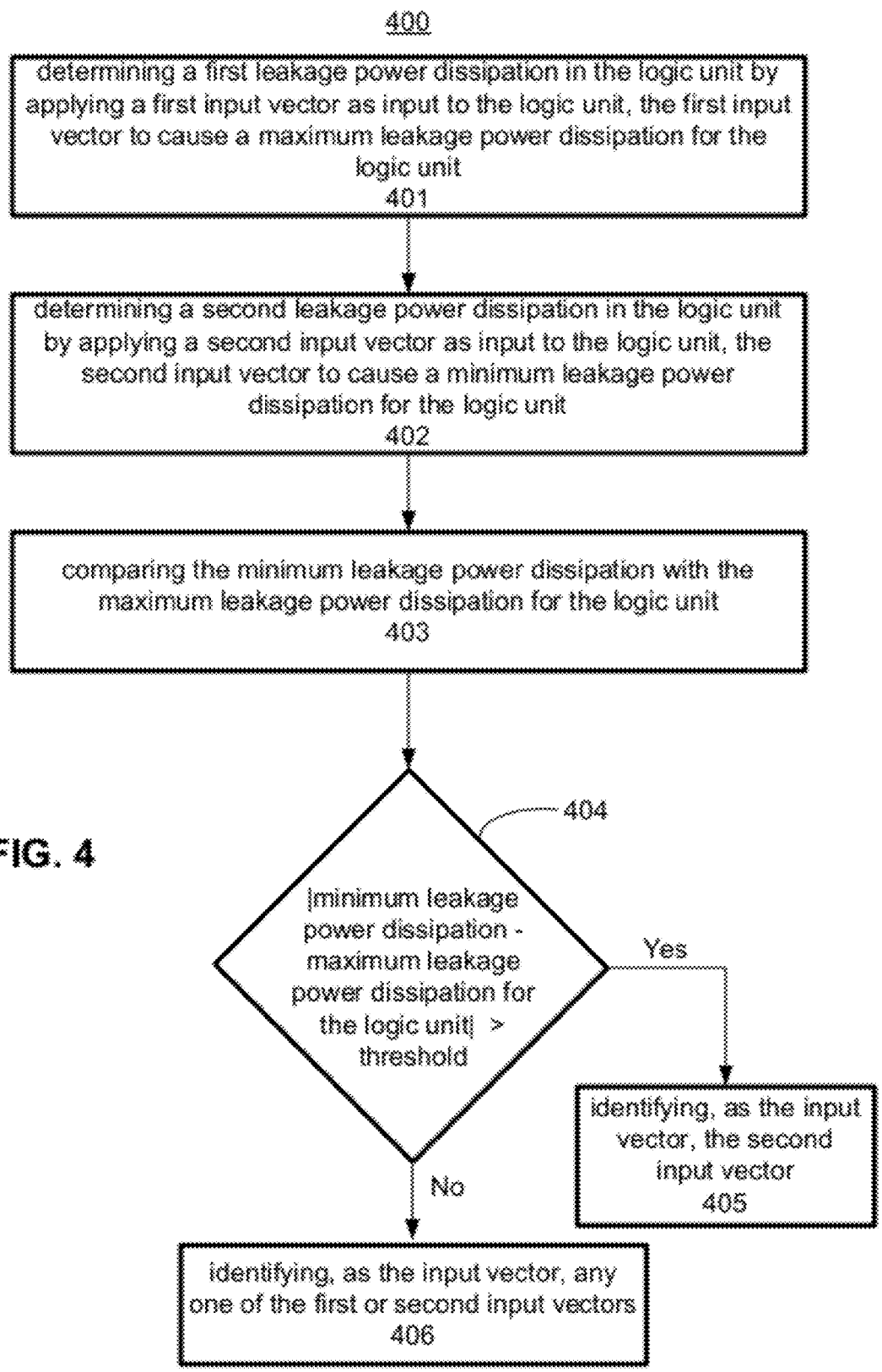
FIG. 4 is a method flowchart for determining the input vector for the combinational logic for reducing leakage power consumption, according to one embodiment of the invention.

FIG. 4 is a method flowchart 400 for determining the input vector for the combinational logic gates $103_N$ for reducing leakage power consumption, according to one embodiment of the invention. Although the blocks in the flowchart 400 are shown in a particular order, the order of the actions can be modified. Thus, the illustrated embodiments can be performed in a different order, and some actions/blocks may be performed in parallel. Additionally, one or more actions/blocks can be omitted in various embodiments of determining the input vector for the combinational logic gates for reducing leakage power consumption in the processor. The flowchart of FIG. 4 is illustrated with reference to the embodiments of FIGS. 1-3.

At block 401, a first leakage power dissipation of the combinational logic unit $103_N$ is determined by applying a first input vector as input to the combinational logic unit $103_N$, wherein the first input vector to cause maximum leakage power dissipation in the combinational logic unit $103_N$. Referring to FIG. 2B, for the combinational logic unit $103_N$ of FIG. 2A, maximum leakage power dissipation in the combinational logic unit $103_N$ is caused when the input vector is all logical high levels, i.e. A0-A7 and B0-B7 are all ones.

Referring back to FIG. 4, at block 402 a second leakage power dissipation of the combinational logic unit $103_N$ is determined by applying a second input vector as input to the combinational logic unit $103_N$, wherein the second input vector to cause minimum (or least) leakage power dissipation in the combinational logic unit $103_N$. Referring to FIG. 2B, for the combinational logic unit $103_N$ of FIG. 2A, minimum leakage power dissipation in the combinational logic unit $103_N$ is caused when the input vector is all logical low levels, i.e. A0-A7 and B0-B7 are all zeros.

Referring back to FIG. 4, at block 403 the maximum and the minimum leakage power dissipation are compared with one another. At block 404, a determination is made whether the absolute difference between the minimum and maximum power dissipations for the combinational logic unit $103_N$ is greater than a predetermined threshold. In one embodiment, the predetermined threshold is programmable by software or hardware. The predetermined threshold indicates the tolerance level of enabling the application of a special input vector from the first logic module $102_N$ to the combinational logic unit $103_N$. In one embodiment, the threshold is 10% and is compared with percentage absolute difference between the minimum and maximum power dissipations for the combinational logic unit $103_N$. In other embodiments, other threshold values may be used without changing the scope of the embodiments of the invention.

At block 405, if the absolute difference between the minimum and maximum power dissipations for the combinational logic unit $103_N$ is greater than the predetermined threshold, the second input vector is identified as the input vector to be applied by the first logic module $102_N$ to the combinational logic unit $103_N$ when the clock_d signal is gated by the clock gating unit 105.

At block 406, if the absolute difference between the minimum and maximum power dissipations for the combinational logic unit $103_N$ is not greater, i.e. less or equal to, than the predetermined threshold, the first input vector is identified as the input vector to be applied by the first logic module $102_N$ to the combinational logic unit $103_N$ when the clock_d signal is gated by the clock gating unit 105. In one embodiment, any one of the first or second input vectors is identified as the input vector to be applied as input to the combinational logic gates $103_N$ if the difference between the minimum leakage power dissipation and the maximum leakage power dissipation for the logic unit is below the threshold.

In one embodiment, the method flowchart further comprises identifying, as the input vector, the third input vector if a difference between the minimum, i.e. second, leakage power dissipation and the third leakage power dissipation for the logic unit is below a threshold. In one embodiment, the method flowchart further comprises identifying, as the input vector, the second input vector if a difference between the minimum leakage power dissipation and the third leakage power dissipation for the logic unit exceeds the threshold. In such embodiments, when the clock_d signal is gated and the difference between the minimum leakage power dissipation and the third leakage power dissipation for the logic unit is below the threshold, then the random input vector (i.e., the third input vector) is used as input to the combinational logic gates $103_N$. In one embodiment, when the difference between the minimum leakage power dissipation and the third leakage power dissipation for the logic unit is below the threshold, the previous input vector values to the combinational logic gates $103_N$ are applied because the special input vector from the first logic module $102_N$ does not make much difference in reducing the leakage power dissipation from the combinational logic gates $103_N$.

Figure 5:
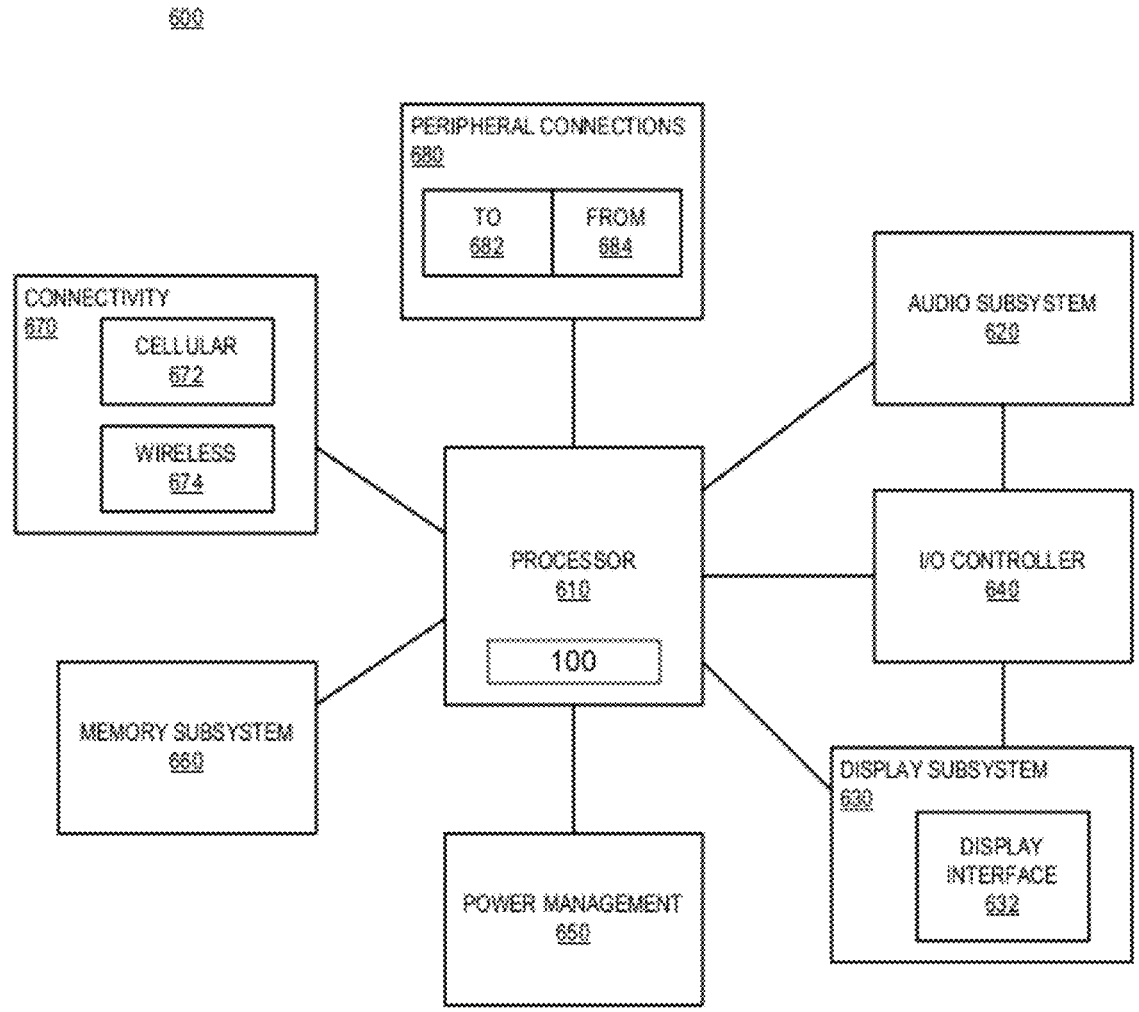
FIG. 5 is a system-level diagram of a smart device comprising a processor which is operable to reduce leakage power consumption, according to one embodiment of the invention.

FIG. 5 is a system-level diagram 600 of a smart device comprising a processor which is operable to reducing leakage power consumption, according to one embodiment of the invention. FIG. 5 also illustrates a block diagram of an embodiment of a mobile device in which flat surface interface connectors could be used. Computing device 600 represents a mobile computing device, such as a computing tablet, a mobile phone or smart-phone, a wireless-enabled e-reader, or other wireless mobile device. It will be understood that certain of the components are shown generally, and not all components of such a device are shown in device 600.

Device 600 includes processor 610, which performs the primary processing operations of device 600. In one embodiment, the processor 610 includes processor 100 with logic 102 for providing input vectors that result in least leakage power consumption in the processor 610 as discussed with reference to FIGS. 1-4.

Referring back to FIG. 5, the processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations may also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touch screen, the display device also acts as an input device, which can be at least partially managed by I/O controller 640. There can also be additional buttons or switches on device 600 to provide I/O functions managed by I/O controller 640.

In one embodiment, the I/O controller 640 manages devices such as accelerometers, cameras, light sensors or other environmental sensors, or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation. Memory subsystem 660 includes memory devices for storing information in device 600. Memory can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600.

Elements of embodiments are also provided as a machine-readable medium (e.g., memory 660) for storing the computer-executable instructions (e.g., instructions to implement the flowcharts of FIGS. 3-4 and any other processes discussed herein). The machine-readable medium (e.g., memory 660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

Connectivity 670 includes hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or an element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description. For example, as process technology advances/changes and the leakage behavior of the transistors in the combinational logic gates $103_N$ change, a new least leakage dissipation input vector may be programmed. In one embodiment, the new least leakage dissipation input vector is downloaded to the memory of the processor or coupled to the processor. In such an embodiment, the first logic module $102_N$ applies the new least leakage dissipation input vector to the combinational logic gates $103_N$ when the clock_d signal is gated. While the embodiments are explained with NAND and NOR logic gates, least leakage vectors for any logic gate and any transistor size (W/L) in the logic gates may be computed and used for reducing overall leakage of the processor. The embodiments of the invention are intended to embrace all such alternatives, modifications, and variations as to fall within the broad scope of the appended claims.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. A processor comprising:
a first logic module for storing an input vector for a combinational logic unit, the input vector for generating least leakage power dissipation in the combinational logic unit; and
a sequential logic unit for applying the input vector as input to the combinational logic unit when a clock signal to the sequential logic unit is gated, wherein the input vector to cause set or reset nodes of the sequential logic unit to apply the input vector to the combinational logic unit.

2. The processor of claim 1 further comprises:
a second logic module for un-gating the clock signal to the sequential logic unit, wherein the sequential logic unit is operable to gate the input vector to cause the combinational logic unit to receive another input vector from the sequential logic unit.

3. The processor of claim 1, wherein the input vector, for generating least leakage power dissipation in the combinational logic unit, is generated by a logic unit which is operable to:
determine a first leakage power dissipation in the combinational logic unit by applying a first input vector to the combinational logic unit, the first input vector to cause a maximum leakage power dissipation for the combinational logic unit.

4. The processor of claim 3, wherein the logic unit which is operable to:
determine a second leakage power dissipation in the combinational logic unit by applying a second input vector to the combinational logic unit, the second input vector to cause a minimum leakage power dissipation for the combinational logic unit.

5. The processor of claim 4, wherein the logic unit is further operable to:
compare the minimum leakage power dissipation with the maximum leakage power dissipation for the combinational logic unit.

6. The processor of claim 5, wherein the logic unit is further operable to:
identify, as the input vector, the second input vector if a difference between the minimum leakage power dissipation and the maximum leakage power dissipation for the combinational logic unit exceeds a threshold.

7. The processor of claim 6, wherein the logic unit is further operable to:
identify, as the input vector, any one of the first or second input vectors if the difference between the minimum leakage power dissipation and the maximum leakage power dissipation for the combinational logic unit is below the threshold.

8. A system comprising:
a display unit; and
a processor communicatively coupled to the display unit, the processor including:
a first logic module for storing an input vector for a combinational logic unit, the input vector for generating least leakage power dissipation in the combinational logic unit; and
a sequential logic unit for applying the input vector to the combinational logic unit when a clock signal to the sequential logic unit is gated, wherein the input vector is to cause set or reset nodes of the sequential logic unit to apply the input vector to the combinational logic unit.

9. The system of claim 8, wherein the processor further comprises:
a second logic module for un-gating the clock signal to the sequential logic unit, wherein the sequential logic unit is operable to gate the input vector to cause the combinational logic unit to receive another input vector from the sequential logic unit.

10. The system of claim 8, wherein the input vector, for generating a least leakage power dissipation in the combinational logic unit, is generated by a logic unit which is operable to:
determine a first leakage power dissipation in the combinational logic unit by applying a first input vector to the combinational logic unit, the first input vector to cause a maximum leakage power dissipation for the combinational logic unit.

11. The system of claim 10, wherein the input vector, for generating a least leakage power dissipation in the combinational logic unit, is generated by a logic unit which is operable to:
determine a second leakage power dissipation in the combinational logic unit by applying a second input vector to the combinational logic unit, the second input vector to cause a minimum leakage power dissipation for the combinational logic unit.

12. The system of claim 11, wherein the logic unit is further operable to:
compare the minimum leakage power dissipation with the maximum leakage power dissipation for the combinational logic unit.

13. The system of claim 12, wherein the logic unit is further operable to:
identify, as the input vector, the second input vector if a difference between the minimum leakage power dissipation and the maximum leakage power dissipation for the combinational logic unit exceeds a threshold.

14. The system of claim 13, wherein the logic unit is further operable to:
identify, as the input vector, any one of the first or second input vectors if the difference between the minimum leakage power dissipation and the maximum leakage power dissipation for the combinational logic unit is below the threshold.

15. A method comprising:
determining an input vector for input to a logic unit, the input vector for generating least leakage power dissipation in the logic unit by,
determining a first leakage power dissipation in the logic unit by applying a first input vector as input to the logic unit, the first input vector to cause a maximum leakage power dissipation for the logic unit,
determining a second leakage power dissipation in the logic unit by applying a second input vector as input to the logic unit, the second input vector to cause a minimum leakage power dissipation for the logic unit,
comparing the minimum leakage power dissipation with the maximum leakage power dissipation for the logic unit, and
identifying, as the input vector, the second input vector if a difference between the minimum leakage power dissipation and the maximum leakage power dissipation for the logic unit exceeds a threshold; and
applying the input vector to the logic unit when a clock signal associated with the logic unit is gated.

16. The method of claim 15 further comprising:
un-gating the clock signal; and
gating the input vector to cause the logic unit to receive another input vector from another logic unit.

17. The method of claim 16 wherein the other logic unit is a sequential logic unit, and wherein gating the input vector comprises:
allowing the sequential logic unit to provide the other input vector to the logic unit.

18. The method of claim 15 wherein determining the input vector for input to the logic unit comprises:
determining a first leakage power dissipation in the logic unit by applying a first input vector as input to the logic unit, the first input vector to cause a maximum leakage power dissipation for the logic unit;
determining a second leakage power dissipation in the logic unit by applying a second input vector as input to the logic unit, the second input vector to cause a minimum leakage power dissipation for the logic unit;
comparing the minimum leakage power dissipation with the maximum leakage power dissipation for the logic unit; and
identifying, as the input vector, the second input vector if a difference between the minimum leakage power dissipation and the maximum leakage power dissipation for the logic unit exceeds a threshold.

* * * * *